United States Patent
Whitten et al.

(10) Patent No.: US 7,969,248 B1
(45) Date of Patent: Jun. 28, 2011

(54) OSCILLATOR TUNING FOR PHASE-LOCKED LOOP CIRCUIT

(75) Inventors: Trent Whitten, Beaverton, OR (US);
Robert M. Bartel, Beaverton, OR (US);
Michael G. France, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 55 days.

(21) Appl. No.: 12/512,961

(22) Filed: Jul. 30, 2009

(51) Int. Cl.
*H03L 7/00* (2006.01)

(52) U.S. Cl. .......... 331/16; 331/179; 331/34; 331/177 R (58) Field of Classification Search ............ 331/16, 331/179, 34, 177 R
See application file for complete search history.

(56) References Cited

U.S. PATENT DOCUMENTS

| | | |
|---|---|---|
| 7,382,169 B2 | 6/2008 | Nikolov et al. |
| 7,456,672 B1 | 11/2008 | Callahan et al. |
| 7,692,497 B2 * | 4/2010 | Hao et al. .......... 331/16 |

OTHER PUBLICATIONS

U.S. Appl. No. 11/924,088, Robert Bartel.
Wilson et al., A CMOS Self-Calibrating Frequency Synthesizer, IEEE Journal of Solid-State Circuits, IEEE Journal of Solid-State Circuits, vol. 35, No. 10, Oct. 2000, pp. 1437-1444.

* cited by examiner

*Primary Examiner* — Arnold Kinkead
(74) *Attorney, Agent, or Firm* — Haynes and Boone, LLP (57) ABSTRACT

In one example, a method of tuning an oscillator of a phase-locked loop (PLL) circuit includes adjusting a coarse control signal to select one of a plurality of frequency tuning curves of the oscillator. The method includes adjusting a fine control signal to select a position on the selected frequency tuning curve. A frequency of the oscillator is determined by the coarse control signal and the fine control signal. The method includes attempting to detect a lock between a feedback signal and a reference signal. A frequency of the feedback signal is determined by the frequency of the oscillator. The method includes comparing the fine control signal to a reference value if the lock is detected. The method includes adjusting the coarse control signal to select a different one of the frequency tuning curves if the selected position on the selected frequency tuning curve is outside a desired tuning range.

18 Claims, 3 Drawing Sheets

FIG. 3

OSCILLATOR TUNING FOR PHASE-LOCKED LOOP CIRCUIT

TECHNICAL FIELD

The present invention relates generally to phase-locked loop (PLL) circuits, and more specifically to the tuning of oscillators used in connection with PLLs.

BACKGROUND

As is well known, conventional PLL circuits are often used to lock an oscillator, such as a voltage controlled oscillator (VCO), to a reference signal. One problem associated with such circuits is phase noise (i.e., jitter) exhibited on the output signal generated by the VCO.

In one approach, to reduce such jitter, the VCO may be implemented with a relatively low gain. As a result, a change in the VCO's control voltage will cause only a modest change in output signal frequency. Unfortunately, this approach can reduce the usable frequency range of the VCO.

In another approach, a PLL circuit may be implemented with a VCO having two input paths for receiving signals from two analog tuning loops. The first input path may apply a high gain to a first control signal received from the first analog tuning loop to perform a fast coarse tuning of the VCO. The second input path may apply a low gain to a second control signal received from the second analog tuning loop to perform a slow fine tuning of the VCO. Unfortunately, this approach requires complex analog circuitry and involves additional loop dynamics in comparison to more conventional PLL circuits. As a result, there is a need for an improved PLL circuit implementation.

SUMMARY

In accordance with one embodiment of the present invention, a method of tuning an oscillator of a phase-locked loop (PLL) circuit includes adjusting a coarse control signal to select one of a plurality of frequency tuning curves of the oscillator; adjusting a fine control signal to select a position on the selected frequency tuning curve, wherein a frequency of the oscillator is determined by the coarse control signal and the fine control signal; attempting to detect a lock between a feedback signal and a reference signal, wherein a frequency of the feedback signal is determined by the frequency of the oscillator; comparing the fine control signal to a reference value if the lock is detected; and adjusting the coarse control signal to select a different one of the frequency tuning curves if the selected position on the selected frequency tuning curve is outside a desired tuning range.

In accordance with another embodiment of the present invention, a phase-locked loop (PLL) circuit includes an oscillator adapted to receive a coarse control signal and a fine control signal wherein a frequency of the oscillator is determined by the coarse control signal and the fine control signal; a state machine adapted to adjust the coarse control signal to select one of a plurality of frequency tuning curves of the oscillator; a tuning loop adapted to adjust the fine control signal to select a position on the selected frequency tuning curve; a lock detector adapted to attempt to detect a lock between a feedback signal and a reference signal, wherein a frequency of the feedback signal is determined by the frequency of the oscillator; a comparator adapted to compare the fine control signal to a reference value if the lock is detected; and wherein the state machine is adapted to adjust the coarse control signal to select a different one of the frequency tuning curves if the selected position on the selected frequency tuning curve is outside a desired tuning range.

In accordance with another embodiment of the present invention, a phase-locked loop (PLL) circuit includes an oscillator; means for adjusting a coarse control signal to select one of a plurality of frequency tuning curves of the oscillator; means for adjusting a fine control signal to select a position on the selected frequency tuning curve, wherein a frequency of the oscillator is determined by the coarse control signal and the fine control signal; means for attempting to detect a lock between a feedback signal and a reference signal, wherein a frequency of the feedback signal is determined by the frequency of the oscillator; means for comparing the fine control signal to a reference value if the lock is detected; and means for adjusting the coarse control signal to select a different one of the frequency tuning curves if the selected position on the selected frequency tuning curve is outside a desired tuning range.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various techniques described herein, a PLL circuit can be implemented with a coarse tuning loop and a fine tuning loop. In one embodiment, the coarse tuning loop may be implemented as a digital tuning loop and the fine tuning loop may be implemented as an analog tuning loop. The coarse tuning loop may be used to provide a coarse control signal to adjust the frequency of an oscillator to one of a plurality of possible frequency tuning curves. After the coarse tuning loop has been adjusted, the fine tuning loop may be used to provide a fine control signal to further adjust the frequency of the oscillator along the frequency tuning curve selected by the coarse tuning.

Advantageously, if a signal lock is detected, then a control voltage of the oscillator may be compared to a reference voltage to determine an approximate position on the selected frequency tuning curve. If the control voltage is outside a desired range, then the PLL may return to performing a coarse tuning to select a different one of the frequency tuning curves.

Figure 1:
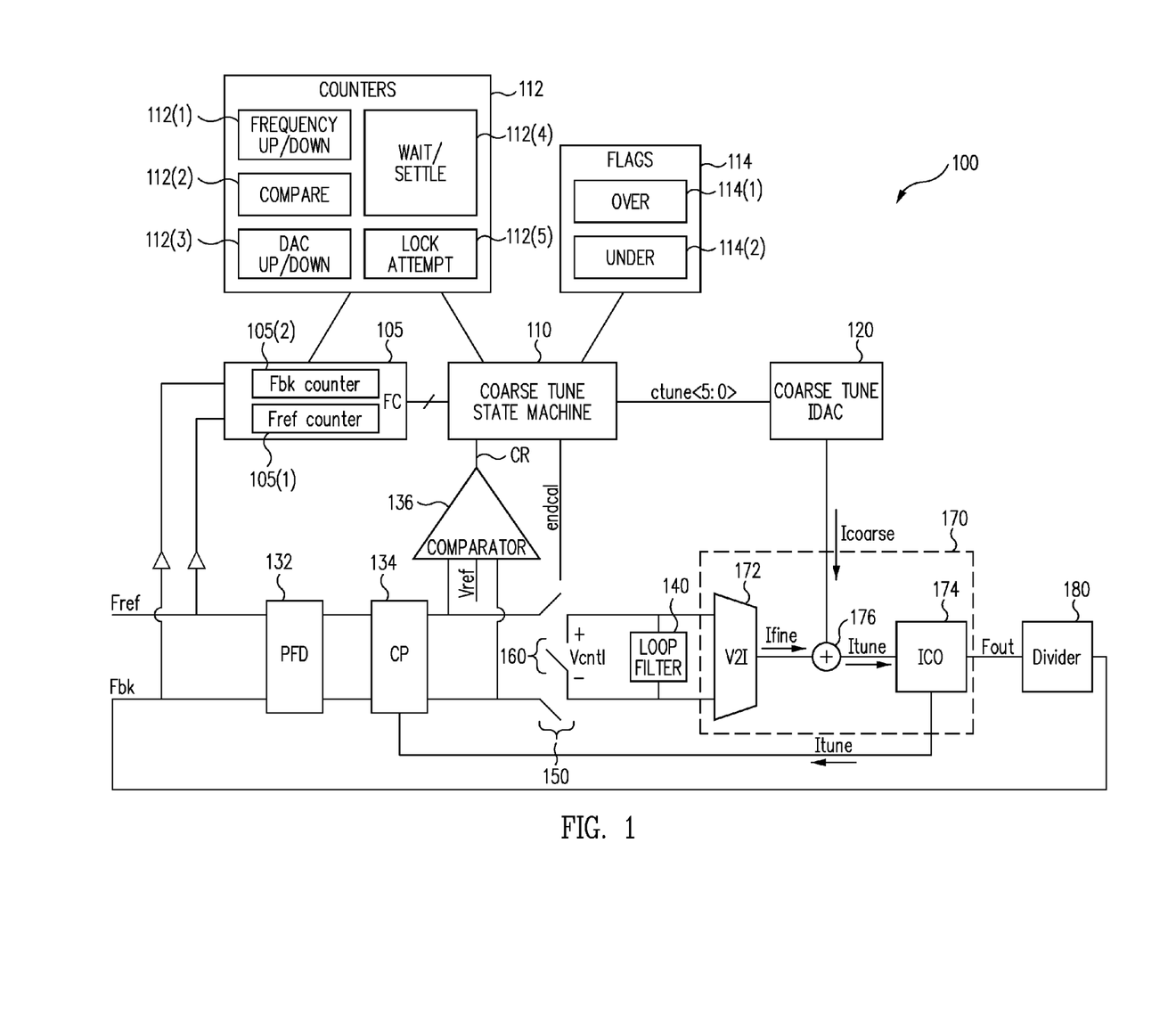
FIG. 1 illustrates a block diagram of a PLL circuit in accordance with an embodiment of the present invention.

FIG. 1 illustrates a block diagram of a PLL circuit 100 in accordance with an embodiment of the present invention.

PLL circuit 100 receives a reference signal Fref and generates an output signal Fout and a feedback signal Fbk in response thereto.

PLL circuit 100 includes a VCO 170 that is initially tuned by a coarse tuning loop and subsequently tuned by a fine tuning loop. The coarse tuning loop includes a frequency comparator 105, a state machine 110, a digital-to-analog converter (DAC) 120, a voltage controlled oscillator (VCO) 170, and a divider block 180. The fine tuning loop includes a phase frequency detector (PFD) 132, a charge pump 134, a loop filter 140, switches 150 and 160, VCO 170, and divider block 180. PLL circuit 100 also includes counters 112, flags 114, and a voltage comparator 136.

PLL circuit 100 may include means such as state machine 110 for adjusting a coarse control signal to select one of a plurality of frequency tuning curves of an oscillator. PLL circuit 100 may also include means such as PFD 132 and charge pump 134 for adjusting a fine control signal to select a position on the selected frequency tuning curve, wherein a frequency of the oscillator is determined by the coarse control signal and the fine control signal. PLL circuit 100 may also include means such as frequency comparator 105, a Fref counter 105(1), and a Fbk counter 105(2) for attempting to detect a lock between a feedback signal and a reference signal, wherein a frequency of the feedback signal is determined by the frequency of the oscillator. PLL circuit 100 may also include means such as voltage comparator 136 for comparing the fine control signal to a predetermined value if the lock is detected. PLL circuit 100 may also include means such as state machine 110 for adjusting the coarse control signal to select a different one of the frequency tuning curves if the selected position on the selected frequency tuning curve is outside a desired tuning range. PLL circuit 100 may also include means such as such as PFD 132 and charge pump 134 for adjusting the fine control signal to select a different position on the selected frequency tuning curve if the selected position on the selected frequency tuning curve is within the desired tuning range and the lock between the feedback signal and the reference signal is lost.

In various embodiments, the components of PLL circuit 100 may be implemented, for example, by application specific hardware, a programmable logic device (PLD) (e.g., such as a field programmable gate array (FPGA), a complex programmable logic device (CPLD), a field programmable system on a chip (FPSC), or other type of programmable device), and/or other appropriate technology.

As shown in FIG. 1, VCO 170 includes a voltage-to-current converter 172, a current controlled oscillator (ICO) 174, and a summing block 176. The frequency of output signal Fout provided by ICO 170 is determined by a coarse control signal which is provided in digital form as a coarse tuning value ctune, and is converted into analog form as a current signal Icoarse by DAC 120. The frequency of output signal Fout is also determined by a fine control signal which is provided in analog form as a control voltage Vcntl and a current signal Ifine. For example, in one embodiment the frequency of output signal Fout is determined by a current signal Itune which is the sum of current signal Icoarse and current signal Ifine. Because output signal Fout is used to provide feedback signal Fbk (i.e., by passing output signal Fout through divider block 180), the coarse and fine control signals may also be used determine the frequency of feedback signal Fbk (i.e., as modified or passed through by divider block 180).

Frequency comparator 105 compares the frequency of reference signal Fref with feedback signal Fbk and indicates to state machine 110 whether reference signal Fref or feedback signal Fbk has a higher frequency during a coarse tuning process. Frequency comparator 105 operates as a lock detector during a fine tuning process and during normal operation of PLL circuit 100.

In one embodiment, frequency comparator 105 may be implemented using Fref counter 105(1) and Fbk counter 105(2) which count the periods of reference signal Fref and feedback signal Fbk, respectively. As reference signal Fref and feedback signal Fbk are received by frequency comparator 105, Fref counter 105(1) and Fbk counter 105(2) may be incremented until either one or both of the counters overflows. In this regard, if Fref counter 105(1) or Fbk counter 105(2) overflows before the other, then this indicates that the frequency of the signal associated with the first overflowing counter is significantly higher than the frequency of the other signal (i.e., more clock periods of the higher frequency signal will have been received than the lower frequency signal since a time that Fref counter 105(1) and Fbk counter 105(2) were reset (e.g., during a state 316 further described herein). However, if Fref counter 105(1) and Fbk counter 105(2) overflow at substantially the same time (i.e., if all bits of Fref counter 105(1) and Fbk counter 105(2) are set to values of "1"), then this indicates that the frequencies of reference signal Fref and feedback signal Fbk are at least coarsely tuned to each other. In one embodiment, the precision of the coarse frequency comparison determined by frequency comparator 105 can be selectively programmed by adjusting the number of bits associated with an overflow condition for Fref counter 105(1) and Fbk counter 105(2) (e.g., from 5 bits/32 counts to 8 bits/256 counts, or other values).

State machine 110 provides coarse tuning value ctune (e.g., a five bit or six bit digital value) to DAC 120. The operation of state machine 110 will be further described herein with regard to the state diagram of FIG. 3.

DAC 120 provides current signal Icoarse to VCO 170 in response to coarse tuning value ctune received from state machine 110. In one embodiment, the least significant bit of coarse tuning value ctune used by DAC 120 may be adjusted in response to changing temperature conditions.

PFD 132 determines differences between reference signal Fref and feedback signal Fbk and operates charge pump 134 based on these differences in accordance with conventional PLL circuit techniques. Charge pump 134 coupled with loop filter 140 provides a control voltage Vcntl (e.g., provided as a differential voltage signal in one embodiment) in response to PFD 132.

Voltage comparator 136 compares control voltage Vcntl with a reference voltage Vref and provides a comparison result to state machine 110. In one embodiment, reference voltage Vref may be set to one of four possible reference voltages such as, for example, 100 mV, 200 mV, 300 mV, or 400 mV. Loop filter 140 operates to smooth out control voltage Vcntl in accordance with conventional PLL circuit techniques.

Switches 150 and 160 are selectively opened and closed in response, for example, to a signal endcal provided by state machine 110. In this regard, while PLL circuit 100 is performing a coarse tuning of VCO 170, switches 150 are open and switch 160 is closed to set control voltage Vcntl to a minimum value (e.g., zero) at the inputs of VCO 170. As a result, current signal Ifine is zero and thus will not contribute to changes in the frequency of output signal Fout (i.e., Icoarse equals Itune while Ifine is zero).

While PLL circuit 100 is performing a fine tuning of VCO 170, switches 150 are closed and switch 160 is opened to permit current signal Ifine to change in response to control voltage Vcntl. As a result, the frequency of output signal Fout is determined by the sum of current signal Icoarse and current signal Ifine. Divider block 180 may be set to divide output signal Fout by any desired value to provide feedback signal Fbk at a frequency equal to or less than output signal Fout.

Counters 112 include a frequency up/down counter 112(1), a compare counter 112(2), a DAC up/down counter 112(3), a wait/settle counter 112(4), and a lock attempt counter 112(5).

Frequency up/down counter 112(1) may be adjusted in response to frequency comparator 105 to track the number of times that feedback signal Fbk or reference signal Fref has exhibited a higher frequency relative to the other. For example, in one embodiment, frequency up/down counter 112(1) may be preset to a midpoint value and then incremented when the frequency of feedback signal Fbk is higher than reference signal Fref (e.g., if Fbk counter 105(2) overflows before Fref counter 105(1)), and decremented when the frequency of feedback signal Fbk is lower than reference signal Fref (e.g., if Fref counter 105(1) overflows before Fbk counter 105(2)).

In one embodiment, frequency up/down counter 112(1) may be a six bit counter with a hexadecimal preset value of 20 (i.e., 32 in decimal) and may be clocked by a clock signal Frefby8 provided, for example, by dividing reference signal Fref by eight. In this regard, frequency up/down counter 112(1) may run at one eighth the speed of reference signal Fref. In one embodiment, frequency up/down counter 112(1) may be set to the preset value when reset during a settle state (further described herein) or in response to a power on reset or other reset of a device in which PLL circuit 100 is implemented.

Compare counter 112(2) may be used to keep track of the number of frequency comparisons performed by frequency comparator 105. In one embodiment, compare counter 112(2) may be programmed to count up to 4, 6, 8, or 16 frequency comparisons. In one embodiment, compare counter 112(2) may be a four bit counter that is clocked by clock signal Frefby8 and may be reset during a settle state (further described herein) or in response to a power on reset or other reset of a device in which PLL circuit 100 is implemented.

DAC up/down counter 112(3) may be used to provide coarse tuning value ctune. In this regard, DAC up/down counter 112(3) may be adjusted by state machine 110 to adjust coarse tuning value ctune. In one embodiment, DAC up/down counter 112(3) may be a six bit counter that is clocked by clock signal Frefby8 and may be reset in response to a power on reset or other reset of a device in which PLL circuit 100 is implemented.

Wait/settle counter 112(4) may be used during wait and settle states (further described herein). In one embodiment, wait/settle counter 112(4) may be a nine bit counter that is reset during an attempt lock state (further described herein) or in response to power on reset or other reset of a device in which PLL circuit 100 is implemented.

During the wait state, wait/settle counter 112(4) may be used to cause state machine 110 to wait for control voltage Vcntl to settle after a fine tuning has been performed. In one embodiment, during the wait state, wait/settle counter 112(4) may be incremented when either Fref counter 105(1) or Fbk counter 105(2) overflows (e.g., based on an OR logic operation performed on appropriate overflow signals of Fref counter 105(1) and Fbk counter 105(2). Also during the wait state, wait/settle counter 112(4) may be programmed to count up to a bit value corresponding to 1, 3, 4, or 9 bits (e.g., count up to decimal values of 2, 8, 16, or 512).

During the settle state, wait/settle counter 112(4) may be used to cause state machine 110 to wait for reference signal Fref and feedback signal Fbk to settle and also wait for the frequency of ICO 174 to stabilize after coarse tuning value ctune has been updated. In one embodiment, during the settle state, wait/settle counter 112(4) may be clocked by clock signal Frefby8 and may be programmed to count up to a bit value corresponding to 3, 5, 7, or 9 bits (e.g., count up to decimal values of 8, 32, 128, or 512).

Lock attempt counter 112(5) may be used to count up to a desired maximum value while the fine tuning loop of PLL circuit 110 attempts to lock feedback signal Fbk with reference signal Fref. In one embodiment, lock attempt counter 112(5) be a ten bit counter that is clocked by signal lockattempt and may be reset during a normal operation state (further described herein) or in response to a power on reset or other reset of a device in which PLL circuit 100 is implemented. In one embodiment, lock attempt counter 112(5) may be programmed to count up to a maximum value corresponding to 2, 3, 6, or 8 bits (e.g., count up to decimal values of 4, 8, 64, or 256).

Flags 114 include an over flag 114(1) and an under flag 114(2). In one embodiment, over flag 114(1) may be provided by a flip-flop that is set when frequency comparator 105 indicates that signal Fbk has a higher frequency than reference signal Fref. In one embodiment, under flag 114(2) may be provided by a flip-flop that is set when frequency comparator 105 indicates that signal Fbk has a lower frequency than reference signal Fref. Flags 114 may be reset during an attempt lock state (further described herein) or in response to a power on reset or other reset of a device in which PLL circuit 100 is implemented.

Figure 2:
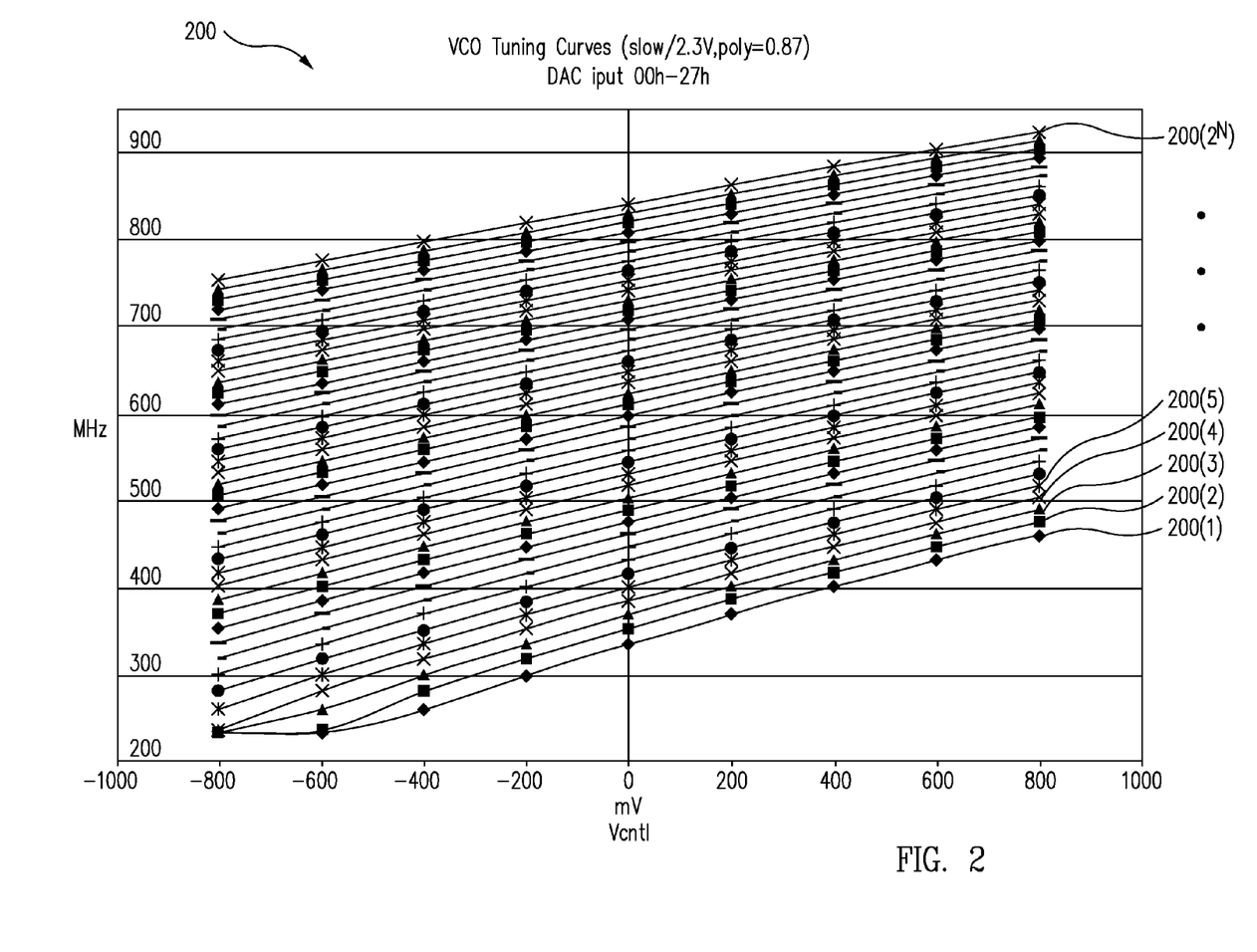
FIG. 2 illustrates a plurality of frequency tuning curves for the oscillator of the PLL circuit of FIG. 1 in accordance with an embodiment of the present invention.

FIG. 2 illustrates a plurality of frequency tuning curves 200 for ICO 174 of PLL circuit 100 of FIG. 1 in accordance with an embodiment of the present invention. In particular, the different frequency tuning curves 200 (labeled 200(1) to 200($2^N$)) correspond to different values of current Icoarse which is provided by DAC 120 in response to coarse tuning value ctune received from state machine 110. The positions along each frequency tuning curve 200 correspond to different values of current Ifine which is provided by voltage-to-current converter 172 in response to the value of control voltage Vcntl.

State machine 110 may be implemented, for example, as a finite state machine. In one embodiment, state machine 110 may have 16 states which may be held by four flip flops. The following Table 1 identifies the states of state machine 110 and the conditions for transitioning to other states in such an embodiment:

TABLE 1

Figure 3:
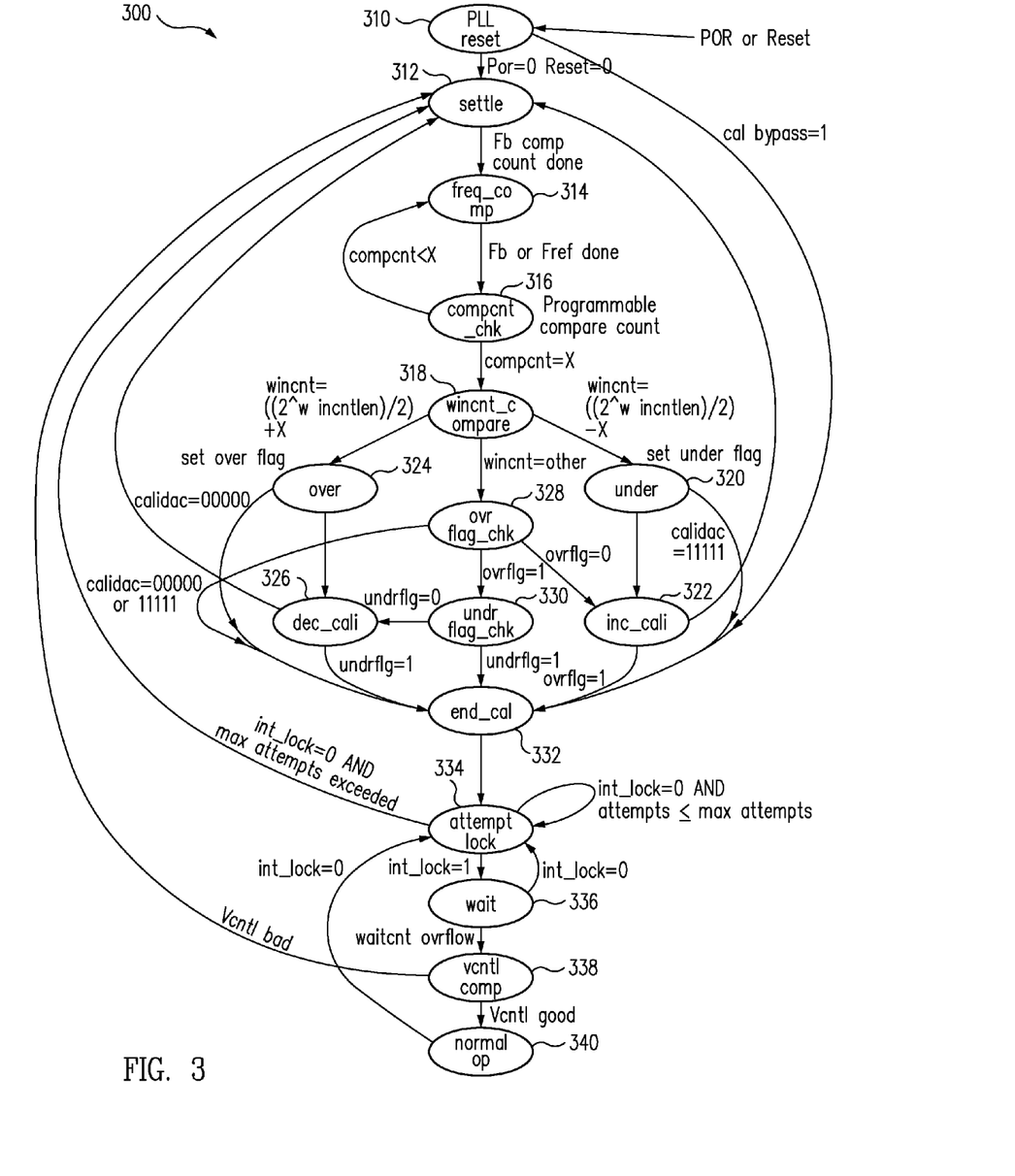
FIG. 3 illustrates a state diagram of a state machine of the PLL circuit of FIG. 1 in accordance with an embodiment of the present invention.

| CURRENT STATE | NEXT STATE | STATE TRANSITION CONDITION |
|---|---|---|
| Reset (310) | Settle (312) | Por AND Reset = 0 AND cal bypass = 0 |
|  | End Cal (332) | cal bypass = 1 |
| Settle (312) | Frequency Compare (314) | wait/settle counter 112(4) overflow |
| Frequency Compare (314) | Compare Count Check (316) | Fref counter 105(1) overflow OR Fbk counter 105(2) overflow |
| Compare Count Check (316) | Frequency Compare (314) | compare counter 112(2) < programmable compare count value |
|  | Win Count Compare (318) | compare counter 112(2) => programmable compare count value |
| Win Count Compare (318) | Under (320) | frequency up/down counter 112(1) = preset value − compare counter 112(2) |
|  | Over (324) | frequency up/down counter 112(1) = preset value + compare counter 112(2) |
|  | Check Over Flag (328) | frequency up/down counter 112(1) != preset value + compare counter 112(2) OR preset value − compare |

TABLE 1-continued

| CURRENT STATE | NEXT STATE | STATE TRANSITION CONDITION |
|---|---|---|
| Under (320) | Increment ctune (322) | counter 112(2) ctune != all ones |
| | End Cal (332) | ctune = all ones |
| Over (324) | Decrement ctune (326) | ctune != all zeroes |
| | End Cal (332) | ctune = all zeroes |
| Check Over Flag (328) | Increment ctune (322) | over flag 114(1) = 0 |
| | End Cal (332) | ctune = all zeroes or all ones |
| | Check Under Flag (330) | over flag 114(1) = 1 |
| Check Under Flag (330) | Decrement ctune (326) | under flag 114(2) = 0 |
| | End Cal (332) | under flag 114(2) = 1 |
| Increment ctune (322) | Settle (312) | over flag 114(1) = 0 |
| | End Cal (332) | over flag 114(1) = 1 |
| Decrement ctune (326) | Settle (312) | under flag 114(2) = 0 |
| | End Cal (332) | under flag 114(2) = 1 |
| End Cal (332) | Attempt Lock (334) | Frefby8 clock edge |
| Attempt Lock (334) | Wait (336) | internal lock = 1 |
| | Settle (312) | internal lock = 0 AND lock attempt counter 112(5) overflow |
| | Attempt Lock (334) | internal lock = 0 AND lock attempt counter 112(5) no overflow |
| Wait (336) | Vcntl Compare (338) | internal lock = 1 AND wait/settle counter 112(4) overflow |
| | Attempt Lock (334) | internal lock = 0 |
| Vcntl Compare (338) | Normal Operation (340) | Vcntl <= reference voltage Vref |
| | Settle (312) | Vcntl > reference voltage Vref |
| Normal Operation (340) | Normal Operation (340) | internal lock = 1 |
| | Attempt lock (334) | internal lock = 0 |

The various states identified in Table 1 will be further described with regard to FIG. 3 which illustrates a state diagram 300 of state machine 110 of PLL circuit 100 of FIG. 1 in accordance with an embodiment of the present invention.

State machine 110 enters state 310 in response to a power on reset or other reset of a device in which PLL circuit 100 is implemented. During state 310, counters 112(1) to 112(5) and flags 114 may be reset. State machine 110 may maintain a data value Por and a data value Reset which indicate whether an additional power on reset or other reset has occurred. State machine 110 may also maintain a data value cal bypass which indicate whether the coarse tuning process should be bypassed.

If cal bypass equals 1, then state machine 110 transitions to state 332. If no further reset operations occur and the coarse tuning process is not bypassed, (e.g., indicated by data values Por, Reset, and cal bypass all equaling zero), then state machine 110 transitions to state 312.

In state 312, state machine 110 begins a coarse tuning process. Accordingly, state machine 110 sets counter 112(1) to its preset value. State machine 110 also resets counter 112(2), opens switches 150, and closes switch 160. As a result, control voltage Vcntl and current signal Ifine are maintained at minimum values, and the frequency of output signal Fout changes only in response to current signal Icoarse.

Also in state 312, state machine 110 waits for wait/settle counter 112(4) to count up from a reset value to a maximum value. The time elapsing during this count permits reference signal Fref and feedback signal Fbk to settle and also permits the frequency of ICO 174 to stabilize if coarse tuning value ctune has been recently updated. After the maximum value is reached (e.g., when wait/settle counter 112(4) overflows the maximum value denoted as "Fb comp count done" in FIG. 3), then state machine 110 transitions to state 314.

In state 314, state machine 110 increments or decrements frequency up/down counter 112(1) based on a comparison of feedback signal Fbk and reference signal Fref performed by frequency comparator 105 (e.g., based upon the overflow of either Fref counter 105(1) or Fbk counter 105(2)). State machine 110 also increments compare counter 112(2) to count the number of comparisons that have been performed (e.g., to count the current comparison plus any previous comparisons performed in any previous occurrences of state 314). After these actions have been performed (denoted as "Fb or Fref done" in FIG. 3), state machine 110 transitions to state 316.

In state 316, state machine 110 compares the value of compare counter 112(2) (denoted "compcnt" in FIG. 3) to a programmable compare count value (denoted "X" in FIG. 3). In one embodiment, the compare count value may be programmed to be 4, 6, 8, or 16 counts. The value of compare counter 112(2) corresponds to the number of comparisons that have been performed by frequency comparator 105 since the last time compare counter 112(2) was reset. If the value of compare counter 112(2) is less than X, then Fref counter 105(1) and Fbk counter 105(2) are reset and state machine 110 transitions to state 314 in which an additional comparison is performed. Otherwise, state machine 110 transitions to state 318. Accordingly, it will be appreciated that the comparison performed in state 316 may be repeated to perform a desired number of iterations until at least "X" comparisons have been performed.

In state 318, state machine 110 compares the value of frequency up/down counter 112(1) (denoted "wincnt" in FIG. 3) to several criteria. If the value of frequency up/down counter 112(1) equals the preset value (denoted $(2^{w\ incntlen})/2$ in FIG. 3) minus the value of compare counter 112(2) (denoted X in FIG. 3), then this indicates that frequency up/down counter 112(1) was decremented for each comparison performed in state 314 (i.e., the frequency of feedback signal Fbk was determined to be lower than reference signal Fref for each of the comparisons). In this case, state machine 110 transitions to state 320.

Also in state 318, if the value of frequency up/down counter 112(1) equals the preset value plus the value of compare counter 112(2), then this indicates that frequency up/down counter 112(1) was incremented for each comparison performed in state 314 (i.e., the frequency of feedback signal Fbk was determined to be higher than reference signal Fref for each of the comparisons). In this case, state machine 110 transitions to state 324.

Also in state 318, if the value of frequency up/down counter 112(1) does not satisfy either of the above-described conditions (denoted wincnt=other in FIG. 3), then this indicates that frequency up/down counter 112(1) was incremented for one or more comparisons and also decremented for one or more comparisons. In this case, state machine 110 transitions to state 328.

In state 320, state machine 110 sets under flag 114(2) (e.g., to a value of 1). Also in state 320, state machine 110 considers coarse tuning value ctune (also denoted "calidac" in FIG. 3). If coarse tuning value ctune is set to a maximum value (e.g., a binary value of 11111 in the case of a 5 bit value or 111111 in the case of a 6 bit value), then state machine 110 transitions to state 332. Otherwise, state machine 110 transitions to state 322.

In state 322, state machine 110 increments DAC up/down counter 112(3) to increment coarse tuning value ctune. Also in state 322, state machine 110 considers over flag 114(1). As previously described, over flag 114(1) may be reset in previous state 310. Accordingly, if over flag 114(1) is still reset (e.g., having a value of 0), then state machine 110 transitions to state 312. Otherwise, if over flag 114(1) has been set (e.g., having a value of 1 set in state 324 further described herein and denoted ovrflg=1 in FIG. 3), then state machine 110 transitions to state 332.

In state 324, state machine 110 sets over flag 114(1) (e.g., to a value of 1). Also in state 324, state machine 110 considers coarse tuning value ctune (also denoted "calidac" in FIG. 3). If coarse tuning value ctune is set to a minimum value (e.g., a binary value of 00000 in the case of a 5 bit value or 000000 in the case of a 6 bit value), then state machine 110 transitions to state 332. Otherwise, state machine 110 transitions to state 326.

In state 326, state machine 110 decrements DAC up/down counter 112(3) to decrement coarse tuning value ctune. Also in state 326, state machine 110 considers under flag 114(2). As previously described, under flag 114(2) may be reset in previous state 310. Accordingly, if under flag 114(2) is still reset (e.g., having a value of 0), then state machine 110 transitions to state 312. Otherwise, if under flag 114(2) has been set (e.g., having a value of 1 set in state 320 previously described herein and denoted undrflg=1 in FIG. 3), then state machine 110 transitions to state 332.

In state 328, state machine 110 considers over flag 114(1). If over flag 114(1) is still reset (e.g., having a value of 0), then state machine 110 transitions to state 322. Otherwise, if over flag 114(1) has been set (e.g., having a value of 1 set in state 324), then state machine 110 transitions to state 330.

In state 330, state machine 110 considers under flag 114(2). If under flag 114(2) is still reset (e.g., having a value of 0), then state machine 110 transitions to state 326. Otherwise, if under flag 114(2) has been set (e.g., having a value of 1 set in state 320), then state machine 110 transitions to state 332.

When state machine 110 transitions to state 332, both over flag 114(1) and under flag 114(2) will have been set. This indicates that feedback signal Fbk has been found to be higher than reference signal Fref for at least a set of X sequential comparisons (i.e., causing over flag(1) to be set), and also indicates that feedback signal Fbk has been found to be lower than reference signal Fref for at least another set of X sequential comparisons (i.e., causing under flag(2) to be set). Accordingly, upon transitioning to state 332, state machine 110 may have adjusted coarse tuning value ctune to set feedback signal Fbk near the frequency of reference signal Fref. In this regard, coarse tuning value ctune will have selected one of frequency tuning curves 200 of FIG. 2. Upon receiving a clock edge of signal Frefby8, state machine 110 transitions to state 334.

In state 334, state machine 110 begins a fine tuning process (also referred to a lock attempt process) to attempt to lock feedback signal Fbk with reference signal Fref. Accordingly, state machine 110 closes switches 150 and opens switch 160. As a result, control voltage Vcntl is permitted to change (i.e., in response to the operation of PFD 132 and charge pump 134) which causes current signal Ifine to also change. Also during state 334, state machine 110 resets wait/settle counter 112(4).

Referring again to FIG. 2, it will be appreciated that while control voltage Vcntl is set to zero, the frequency of VCO 170 will be approximately in the midpoint of any of frequency tuning curves 200 which may have been selected during the coarse tuning process. As control voltage Vcntl is adjusted to positive or negative voltages, the frequency of VCO 170 will be adjusted along the selected frequency tuning curve 200. Advantageously, frequency tuning curves 200 exhibit a gradual slope with changes in control voltage Vcntl causing only small changes in the frequency of VCO 170. As a result, phase noise (i.e., jitter) in reference signal Fref, output signal Fout, feedback signal Fbk, and control voltage Vcntl will not significantly disrupt the frequency of VCO 170.

While in state 334, lock attempt counter 112(5) begins counting up to a preset maximum value while the fine tuning loop attempts to lock feedback signal Fbk to reference signal Fref. If a lock occurs (e.g., denoted by a logic value int_lock stored by a flip-flop being set to 1 in response to Fref counter 105(1) and a Fbk counter 105(2) overflowing at substantially the same time), then state machine 110 transitions to state 336. Otherwise, if no lock occurs (e.g., denoted by logic value int_lock remaining at 0), then state machine 110 remains in state 334 until lock attempt counter 112(5) exceeds the maximum value (e.g., overflows), at which time state machine 110 transitions to state 312.

In state 336, state machine 110 waits to determine whether feedback signal Fbk remains locked to reference signal Fref. For example, this waiting period can permit control voltage Vcntl to settle after a fine tuning has been performed. During state 336, wait/settle counter 112(4) begins counting up to a maximum bit value. If feedback signal Fbk remains locked to reference signal Fref (e.g., int_lock logic value remains set to 1) until wait/settle counter 112(4) reaches the maximum value (e.g., overflows), then state machine 110 transitions to state 338. Otherwise, if lock is lost (e.g., int_lock logic value changes to 0), then state machine 110 transitions to state 334.

In state 338, PLL circuit 100 performs a further check on the lock between feedback signal Fbk and reference signal Fref. In particular, voltage comparator 136 compares control voltage Vcntl with reference voltage Vref and provides a comparison result signal CR to state machine 110 to indicate whether control voltage Vcntl is within a desired range.

In one embodiment, control voltage Vcntl may be implemented as a differential voltage that is symmetric around a common mode voltage. In this embodiment, reference voltage Vref may be generated relative to the common mode voltage. Also in this embodiment, voltage comparator 136 may be implemented as two comparators, specifically: a first comparator to compare a first differential end of control voltage Vcntl to reference voltage Vref, and a second comparator to compare a second differential end of control voltage Vcntl to reference voltage Vref. The results of the two comparators may be logically ORed together within voltage comparator 136 to provide comparison result signal CR from voltage comparator 136 to state machine 110.

If either of the first or second differential ends of control voltage Vcntl is greater than reference voltage Vref, then voltage comparator 136 toggles comparison result signal CR to indicate that control voltage Vcntl is outside the desired range. In this case (denoted "Vcntl bad" in FIG. 3), state machine 110 transitions to state 312. Otherwise, if control voltage Vcntl is within the desired range (denoted "Vcntl good" in FIG. 3), then state machine 110 transitions to state 340.

Referring again to FIG. 2, it will be appreciated that as control voltage Vcntl is adjusted, the frequency of VCO 170 will be adjusted along the selected frequency tuning curve 200. In one embodiment, it is preferred that control voltage Vcntl is close to a midpoint of the selected frequency tuning curve 200 (e.g., having a value of approximately zero) when lock is achieved. Such a position permits control voltage Vcntl to be increased or decreased in order to maintain lock while compensating for temperature variations, process variations, or other factors.

If lock is achieved when control voltage Vcntl is near the left or right end of the selected frequency tuning curve 200, then very little margin remains for adjusting control voltage Vcntl (e.g., control voltage Vcntl may be adjusted to the extreme left or right end and still be unable to maintain lock). In such a case, it may be preferred to select another frequency tuning curve 200 in which the same frequency can be maintained with control voltage Vcntl having a value closer to the midpoint value of 0 when lock is achieved. Advantageously, the same frequency of VCO 170 may be achieved using different frequency tuning curves 200 with different values of control voltage Vcntl.

For example, as shown in FIG. 2, a frequency of approximately 400 MHz may be achieved by selecting frequency tuning curve 200(1) with a control voltage Vcntl of approximately 400 mV, and may also be achieved by selecting frequency tuning curve 200(5) with a control voltage Vcntl of approximately 0 mV. In this case, frequency tuning curve 200(5) would be preferred. Accordingly, in this example, state machine 110 would transition to state 312 to resume the coarse tuning process to select another one of frequency tuning curves 200.

In state 340, state machine 110 enters normal operation in which the frequency of VCO 170 is maintained in accordance with the coarse tuning value ctune determined during the coarse tuning process and the control voltage Vcntl determined during the fine tuning process. During state 340, frequency comparator 105 continues to operate Fref counter 105(1) and Fbk counter 105(2) to determine whether feedback signal Fbk and reference signal Fref remain coarsely tuned to each other. If the coarse tuning lock between feedback signal Fbk and reference signal Fref is lost (i.e., indicated by logic value int_lock being set to 0 in response to Fref counter 105(1) or Fbk counter 105(2) overflowing before the other), then state machine 110 transitions to state 334 to attempt to regain lock between feedback signal Fbk and reference signal Fref.

Embodiments described above illustrate but do not limit the invention. It should also be understood that numerous modifications and variations are possible in accordance with the principles of the present invention. Accordingly, the scope of the invention is defined only by the following claims.

We claim:

1. A method of tuning an oscillator of a phase-locked loop (PLL) circuit, the method comprising:
    adjusting a coarse control signal to select one of a plurality of frequency tuning curves of the oscillator;
    adjusting a fine control signal to select a position on the selected frequency tuning curve, wherein a frequency of the oscillator is determined by the coarse control signal and the fine control signal;
    attempting to detect a lock between a feedback signal and a reference signal, wherein a frequency of the feedback signal is determined by the frequency of the oscillator;
    comparing the fine control signal to a reference value if the lock is detected;
    adjusting the coarse control signal to select a different one of the frequency tuning curves if the selected position on the selected frequency tuning curve is outside a desired tuning range; and
    permitting the frequency of the oscillator to settle before the coarse control signal is adjusted,
    wherein the frequency of the oscillator is further determined by:
        comparing the reference signal with the feedback signal;
        increasing the frequency of the oscillator if the frequency of the feedback signal is less than the frequency of the reference signal; and
        decreasing the frequency of the oscillator if the frequency of the feedback signal is greater than the frequency of the reference.

2. The method of claim 1, further comprising adjusting the fine control signal to select a different position on the selected frequency tuning curve if the selected position on the selected frequency tuning curve is within the desired tuning range and the lock between the feedback signal and the reference signal is lost.

3. The method of claim 1, further comprising adjusting the coarse control signal to select a different one of the frequency tuning curves if the lock is not detected.

4. The method of claim 1, wherein the frequency of the oscillator is further determined by:
    repeating the comparing to perform a desired number of iterations;
    setting a first flag and increasing the frequency of the oscillator if the frequency of the feedback signal is less than the frequency of the reference signal for all of the iterations; and
    setting a second flag and decreasing the frequency of the oscillator if the frequency of the feedback signal is greater than the frequency of the reference signal for all of the iterations.

5. The method of claim 4, wherein the adjusting the fine control signal is performed only if both of the first and second flags are set.

6. The method of claim 5, wherein the adjusting a coarse control signal comprises:
    setting a counter to a preset value; and
    during each iteration, selectively increasing or decreasing a current value of the counter based on whether the frequency of the feedback signal is higher or lower than the frequency of the reference signal, wherein the first and second flags are set using the current value of the counter.

7. The method of claim 1, wherein the adjusting a coarse control signal comprises:
    providing a digital coarse tuning value using a state machine;
    converting the digital coarse tuning value to an analog coarse control signal; and
    providing the analog coarse control signal to the oscillator.

8. The method of claim 1, further comprising maintaining the fine control signal at a minimum value while the coarse control signal is adjusted.

9. A phase-locked loop (PLL) circuit comprising:
    an oscillator adapted to receive a coarse control signal and a fine control signal wherein a frequency of the oscillator is determined by the coarse control signal and the fine control signal;
    a state machine adapted to adjust the coarse control signal to select one of a plurality of frequency tuning curves of the oscillator;
    a tuning loop adapted to adjust the fine control signal to select a position on the selected frequency tuning curve;
    a lock detector adapted to attempt to detect a lock between a feedback signal and a reference signal, wherein a frequency of the feedback signal is determined by the frequency of the oscillator;
    a comparator adapted to compare the fine control signal to a reference value if the lock is detected; and
    wherein the state machine is adapted to:

adjust the coarse control signal to select a different one of the frequency tuning curves if the selected position on the selected frequency tuning curve is outside a desired tuning range;

increase the frequency of the oscillator if the frequency of the feedback signal is less than the frequency of the reference signal; and decrease the frequency of the oscillator if the frequency of the feedback signal is greater than the frequency of the reference signal.

10. The PLL circuit of claim 9, wherein the tuning loop is adapted to adjust the fine control signal to select a different position on the selected frequency tuning curve if the selected position on the selected frequency tuning curve is within the desired tuning range and the lock between the feedback signal and the reference signal is lost.

11. The PLL circuit of claim 9, wherein the state machine is adapted to adjust the coarse control signal to select a different one of the frequency tuning curves if the lock is not detected.

12. The PLL circuit of claim 9, wherein the comparator is a first comparator, the PLL circuit further comprising:

a second comparator adapted to compare the reference signal with the feedback signal for a desired number of iterations;

wherein the state machine is adapted to set a first flag and increase the frequency of the oscillator if the frequency of the feedback signal is less than the frequency of the reference signal for all of the iterations; and wherein the state machine is adapted to set a second flag and decrease the frequency of the oscillator if the frequency of the feedback signal is greater than the frequency of the reference signal for all of the iterations.

13. The PLL circuit of claim 12, wherein the state machine is adapted to prevent the tuning loop from adjusting the fine control signal unless both of the first and second flags are set.

14. The PLL circuit of claim 13, wherein the state machine is adapted to:

set a counter to a preset value; and during each iteration, selectively increase or decrease a current value of the counter based on whether the frequency of the feedback signal is higher or lower than the frequency of the reference signal, wherein the first and second flags are set using the current value of the counter.

15. The PLL circuit of claim 9, wherein the coarse control signal is an analog coarse control signal, the PLL circuit further comprising a digital-to-analog converter (DAC) adapted to receive a digital coarse tuning value from the state machine and convert the digital coarse tuning value to the analog coarse control signal.

16. The PLL circuit of claim 9, wherein the state machine is adapted to wait for the frequency of the oscillator to settle before adjusting the coarse control signal.

17. The PLL circuit of claim 9, further comprising a switch adapted to maintain the fine control signal at a minimum value while the coarse control signal is adjusted.

18. A phase-locked loop (PLL) circuit comprising:

an oscillator;

means for adjusting a coarse control signal to select one of a plurality of frequency tuning curves of the oscillator;

means for adjusting a fine control signal to select a position on the selected frequency tuning curve, wherein a frequency of the oscillator is determined by the coarse control signal and the fine control signal;

means for attempting to detect a lock between a feedback signal and a reference signal, wherein a frequency of the feedback signal is determined by the frequency of the oscillator;

means for comparing the fine control signal to a reference value if the lock is detected;

means for adjusting the coarse control signal to select a different one of the frequency tuning curves if the selected position on the selected frequency tuning curve is outside a desired tuning range;

means for adjusting the fine control signal to select a different position on the selected frequency tuning curve if the selected position on the selected frequency tuning curve is within the desired tuning range and the lock between the feedback signal and the reference signal is lost; and means for increasing the frequency of the oscillator if the frequency of the feedback signal is less than the frequency of the reference signal and for decreasing the frequency of the oscillator if the frequency of the feedback signal is greater than the frequency of the reference signal.

* * * * *